(12) United States Patent
Lee et al.

(10) Patent No.: US 9,184,877 B1
(45) Date of Patent: *Nov. 10, 2015

(54) METHOD AND APPARATUS FOR DECODING INDEPENDENTLY ENCODED SIGNALS

(75) Inventors: Jungwon Lee, San Diego, CA (US); Jihwan P. Choi, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 1052 days.

This patent is subject to a terminal disclaimer.

(21) Appl. No.: 12/940,778

(22) Filed: Nov. 5, 2010

Related U.S. Application Data

(60) Provisional application No. 61/259,586, filed on Nov. 9, 2009.

(51) Int. Cl.
  *H04L 27/06* (2006.01)
  *H04L 1/00* (2006.01)
  *H03M 13/41* (2006.01)
  *H03M 13/00* (2006.01)

(52) U.S. Cl.
  CPC ............ *H04L 1/0054* (2013.01); *H03M 13/41* (2013.01); *H03M 13/4107* (2013.01); *H03M 13/6502* (2013.01)

(58) Field of Classification Search
  CPC  H04L 1/0054; H03M 13/41; H03M 13/4107; H03M 13/6502; G11B 20/10009
  USPC ......................................................... 375/341
  See application file for complete search history.

(56) References Cited

U.S. PATENT DOCUMENTS

| 8,675,755 | B1 | 3/2014 | Lee et al. |
| 8,989,314 | B1 | 3/2015 | Lee et al. |
| 2005/0201478 | A1 | 9/2005 | Claussen et al. |
| 2006/0120477 | A1* | 6/2006 | Shen et al. .................. 375/267 |
| 2006/0200733 | A1 | 9/2006 | Stankovic et al. |
| 2006/0215603 | A1* | 9/2006 | Nishio et al. .................. 370/329 |

(Continued)

OTHER PUBLICATIONS

Viterbi, A.J. ; Wolf, J.K. ; Zehavi, E. ; Padovani, R., "A pragmatic approach to trellis-coded modulation," Communications Magazine, IEEE vol. 27 , Issue: 7, Publication Year: 1989 , pp. 11-19.*

(Continued)

*Primary Examiner* — Nader Bolourchi

(57) ABSTRACT

A received signal that includes a plurality of user signals is demodulated. The plurality of user signals includes at least a first user signal and a second user signal. The first user signal corresponds to first user data that has been modulated independently of second user data corresponding to the second user signal, and the first user signal is encoded with a first finite state machine encoder independently of the other user signals. The first finite state machine encoder has a number of states $S_1$. The second user signal is encoded with a second finite state machine encoder independently of the other user signals, and the second finite state machine encoder has a number of states $S_2$. Demodulating the received signal includes calculating distances between (i) each transmit symbol in the received signal and (ii) expected symbol values, wherein each expected symbol value corresponds to user data for multiple users including the first user and the second user. The first user data in the received signal is decoded based on the calculated distances utilizing a finite state machine decoder having $S_1$ states.

20 Claims, 10 Drawing Sheets

(56) References Cited

U.S. PATENT DOCUMENTS

| 2006/0286948 | A1 | 12/2006 | Taniguchi et al. | |
|---|---|---|---|---|
| 2007/0092018 | A1* | 4/2007 | Fonseka et al. | 375/265 |
| 2007/0098103 | A1* | 5/2007 | Murakami et al. | 375/267 |
| 2007/0104293 | A1 | 5/2007 | Hiatt et al. | |
| 2008/0123781 | A1* | 5/2008 | Pisek et al. | 375/340 |
| 2008/0266160 | A1 | 10/2008 | Goodall et al. | |
| 2009/0135926 | A1 | 5/2009 | Tsouri et al. | |
| 2010/0034323 | A1 | 2/2010 | Stoye | |
| 2010/0246720 | A1* | 9/2010 | Wang et al. | 375/316 |
| 2010/0303176 | A1* | 12/2010 | Lilleberg et al. | 375/341 |

OTHER PUBLICATIONS

Proakis, "5-2-7 Probability of Error for M-ary PSK," in *Digital Communications*, 4th ed., pp. 269-274, McGraw-Hill, 2001.

Forney, "Chapter 9, Introduction to convolutional codes," Lecture Notes, available at http://ocw.mitedu/courses/electrical-engineering-and-computer-science/6-451-principles-of-digital-communication-ii-spring-2005/lecture-notes/, pp. 117-134, 2003.

"IEEE Std 802.16 2009 (Revision of IEEE Std. 802.16/2004), IEEE Standard for Local and metropolitan area networks: Part 16: Air Interface for Broadband Wireless Access Systems," *The Institute of Electrical and Electronics Engineers, Inc.*, May 29, 2009.

Jungwon Lee et al., U.S. Appl. No. 12/830,100, "Method and Apparatus for Jointly Decoding Independently Encoded Signals," filed Jul. 2, 2010.

John G. Proakis; Digital Communications; 1995; pp. 269-274; 3rd edition; McGraw-Hill.

G. David Forney; MIT Course Notes 6.451; Principles of Digital Communication II; Spring 2005; pp. 117-134.

Office Action in U.S. Appl. No. 12/830,100, dated Jul. 25, 2012 (9 pages).

Office Action in U.S. Appl. No. 12/830,100, dated Jan. 3, 2013 (11 pages).

Office Action in U.S. Appl. No. 12/830,100, dated May 24, 2013 (11 pages).

Notice of Allowance in U.S. Appl. No. 12/830,100, dated Oct. 30, 2013 (15 pages).

Notice of Allowance in U.S. Appl. No. 12/830,100, dated Jan. 5, 2014 (5 pages).

Office Action in U.S. Appl. No. 14/215,160, dated May 22, 2014 (6 pages).

Notice of Allowance in U.S. Appl. No. 14/215,160, dated Sep. 8, 2014 (7 pages).

Notice of Allowance in U.S. Appl. No. 14/215,160, dated Nov. 14, 2014 (7 pages).

\* cited by examiner

*PRIOR ART*

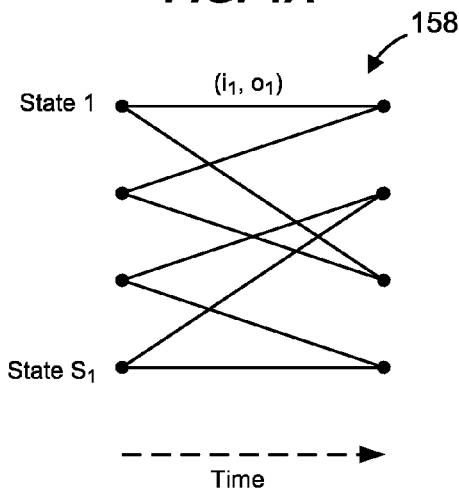
FIG. 4A
PRIOR ART
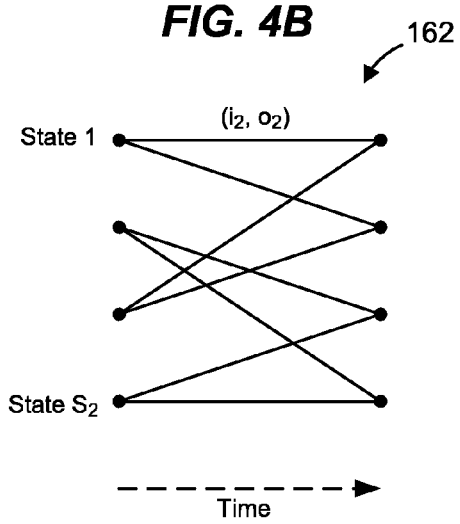
FIG. 4B
PRIOR ART
FIG. 5
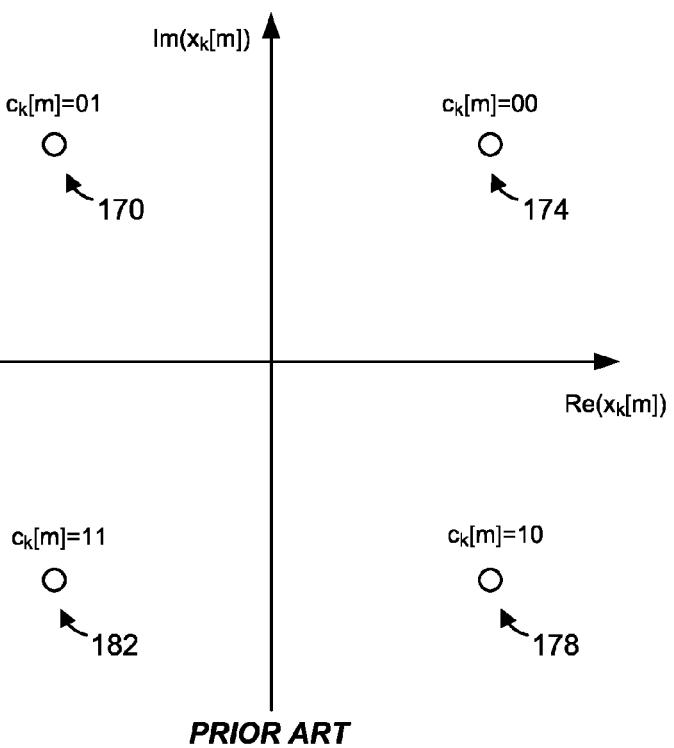
PRIOR ART

*PRIOR ART*

METHOD AND APPARATUS FOR DECODING INDEPENDENTLY ENCODED SIGNALS

CROSS-REFERENCE TO RELATED APPLICATION

This disclosure claims the benefit of U.S. Provisional Patent Application No. 61/259,586, entitled "A New Decoding Method for Trellis Codes Based on the Combined Signal Constellation of Multiple Users," and filed on Nov. 9, 2009, the entire disclosure of which is hereby incorporated by reference herein.

FIELD OF THE DISCLOSURE

The present disclosure relates generally to communication systems and, more particularly, to mitigating interference in a receiver.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In some communication networks, a communication device, such as a base station, simultaneously transmits different data to different communication devices, such as mobile stations. Similarly, in some communication networks, communication devices, such as mobile stations, simultaneously transmit different data to another communication device, such as a base station. In these scenarios, when the different data are transmitted at the same frequency, the different data act as interference to each other.

One technique for mitigating interference is referred to as successive interference canceling (SIC). In SIC, a strongest signal is first demodulated and decoded in the presence of interference caused by other signals. Next, the decoded data is re-encoded, re-modulated, and then subtracted from the other signals. Then, the second strongest signal is demodulated and decoded in the presence of interference caused by the remaining signals. Next, the decoded data is re-encoded, re-modulated, and then subtracted from the remaining signals. Then, the third strongest signal is decoded, and so on.

SUMMARY

In one embodiment, a method includes demodulating a received signal that includes a plurality of user signals, the plurality of user signals including at least a first user signal and a second user signal. The first user signal corresponds to first user data that has been modulated independently of second user data corresponding to the second user signal, and the first user signal is encoded with a first finite state machine encoder independently of the other user signals. The first finite state machine encoder has a number of states $S_1$. The second user signal is encoded with a second finite state machine encoder independently of the other user signals, and the second finite state machine encoder has a number of states $S_2$. Demodulating the received signal includes calculating distances between (i) each transmit symbol in the received signal and (ii) expected symbol values, wherein each expected symbol value corresponds to user data for multiple users including the first user and the second user. The method also includes decoding the first user data in the received signal based on the calculated distances utilizing a finite state machine decoder having $S_1$ states.

In another embodiment, an apparatus is for demodulation and decoding a received signal. The received signal includes a plurality of user signals, and the plurality of user signals includes at least a first user signal and a second user signal. The first user signal corresponds to first user data that has been modulated independently of second user data corresponding to the second user signal, and the first user signal is encoded with a finite state machine encoder independently of the second user signal. The first finite state machine encoder has a number of states $S_1$. The apparatus comprises a demodulator to demodulate the received signal based on calculating distances between (i) transmit symbols in the received signal and (ii) expected symbol values, wherein each expected symbol value corresponds to multiple users including the first user data and the second user data. Additionally, the apparatus comprises a decoder having a finite state machine with $S_1$ states, wherein the decoder is configured to decode the first user data based on the calculated distances.

In yet another embodiment, a method is for processing a received signal that includes a plurality of user signals. The plurality of user signals includes at least a first user signal and a second user signal, and the first user signal corresponds to first user data that has been encoded independently of second user data corresponding to the second user signal. The method includes determining an expected symbol value based on modulation information corresponding to multiple user signals including the first user signal and the second user signal, and calculating distances between (i) each transmit symbol in the received signal and (ii) expected symbol values, wherein each expected symbol value corresponds to user data for multiple users including the first user and the second user. Also, the method includes calculating a plurality of branch metrics corresponding to the first user data, each branch metric calculated based on a respective plurality of the distances, and decoding the first user data in the received signal based on the calculated branch metrics.

In still another embodiment, an apparatus is for demodulating and decoding a received signal that includes a plurality of user signals. The plurality of user signals includes at least a first user signal and a second user signal, and first user data in the first user signal is encoded with a finite state machine encoder independently of second user data in the second user signal. The apparatus comprises a demodulator to demodulate the received signal based on calculating distances between (i) transmit symbols in the received signal and (ii) expected symbol values, wherein each expected symbol value corresponds to user data for multiple users including the first user data and the second user data. The apparatus also comprises a decoder having a branch metric calculator to calculate a plurality of branch metrics corresponding to the first user data, each branch metric calculated based on a respective plurality of the distances. The decoder is configured to decode the first user data in the received signal based on the calculated branch metrics.

BRIEF DESCRIPTION OF THE DRAWINGS

FIGS. 4A and 4B are example trellis diagrams for prior art encoders; and

FIG. 5 is an example constellation diagram corresponding to a prior art modulator;

DETAILED DESCRIPTION

Figure 1A:
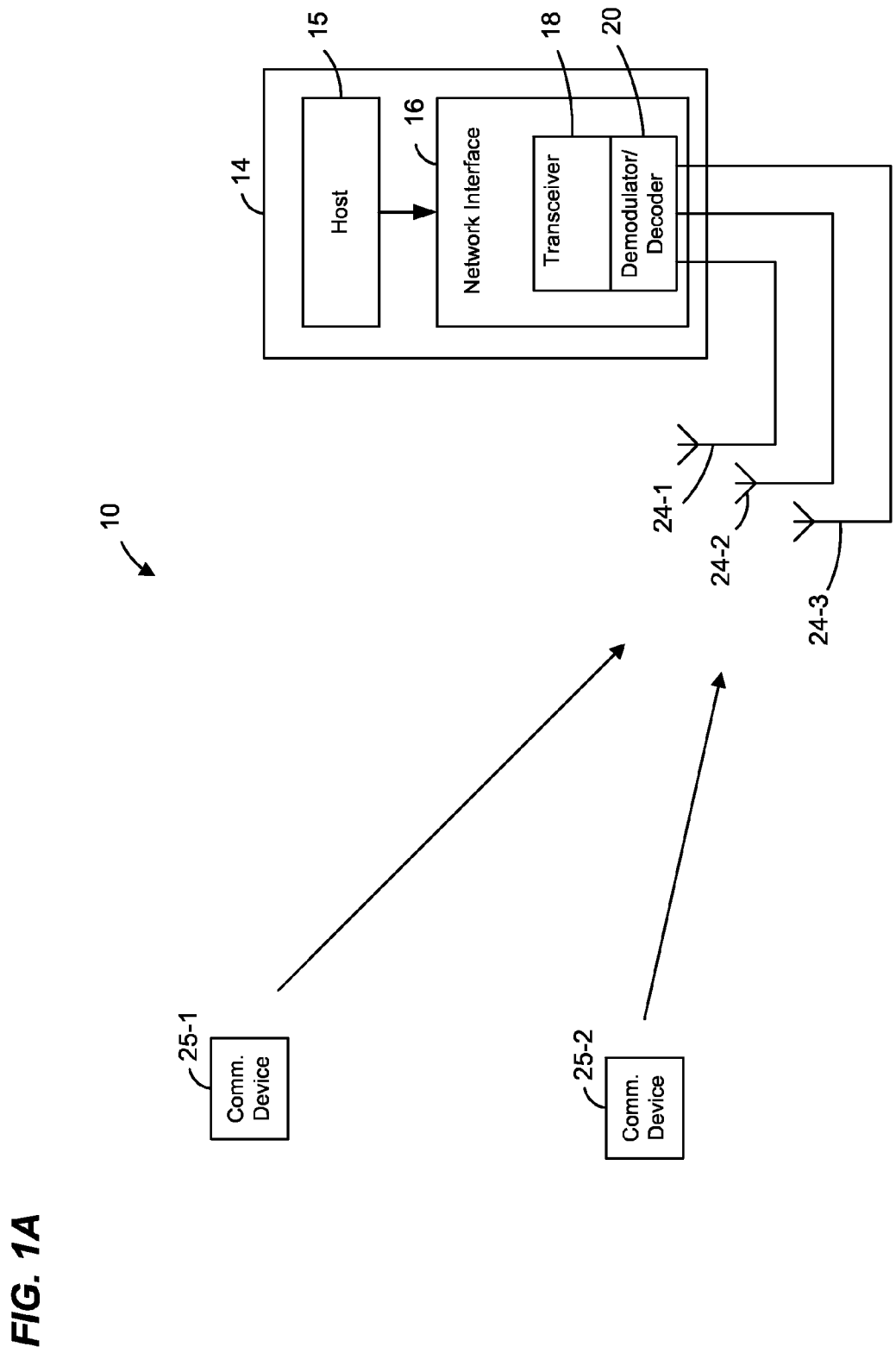
FIG. 1A is a block diagram of example wireless network, according to an embodiment, in which a communication device utilizes joint demodulation and decoding to mitigate interference.

FIG. 1A is a block diagram of an example wireless network 10, according to an embodiment, in which a communication device 14 utilizes joint demodulation and joint decoding to mitigate interference. The communication device 14 includes a host processor 15 coupled to a network interface 16. The network interface 16 includes a transceiver 18. The transceiver 18 is coupled to a plurality of antennas 24. Although three antennas 24 are illustrated in FIG. 1A, the communication device 14 can include different numbers (e.g., 1, 2, 4, 5, etc.) of antennas 24 in other embodiments. In an embodiment, the transceiver 18 includes a joint demodulator/decoder unit 20. The joint demodulator/decoder unit 20 will be described in further detail below.

The wireless network 10 also includes a plurality of communication devices 25. Although two communication devices 25 are illustrated in FIG. 1A, the wireless network 10 can include different numbers (e.g., 3, 4, 5, 6, etc.) of communication devices 25 in various scenarios and embodiments.

Each communication device 25 simultaneously, and at the same frequency, transmits data to the communication device 14. As a result, a signal transmitted by the communication device 25-1 acts as interference with respect to a signal transmitted by the communication device 25-2, and vice versa. As will be described in more detail below, the joint demodulator/decoder unit 20 jointly demodulates and jointly decodes the signal transmitted by the communication device 25-1 and the signal transmitted by the communication device 25-2, according to an embodiment. This joint demodulation and joint decoding mitigates interference caused by the signal transmitted by the communication device 25-1 with respect to the signal transmitted by the communication device 25-2, and vice versa. In some embodiments, more than two communication devices 25 simultaneously, and at the same frequency, transmit data to the communication device 14 resulting in similar interference. The joint demodulator/decoder unit 20 jointly demodulates and jointly decodes the signals transmitted by the more than two communication devices 25, according to some embodiments.

In an implementation in which the network 10 adheres to the Long Term Evolution (LTE) standard of the Third Generation Partnership Project (3GPP), the communication devices 25 are or include user equipment and the communication device 14 is or includes an evolved node B. In an implementation in which the network 10 adheres to the Institute for Electrical and Electronics Engineers (IEEE) 802.16e Standard (i.e., a WiMAX network), the communication devices 25 are mobile stations and the communication device 14 is a base station. In an implementation in which the network 10 is a wireless local area network (WLAN), the communication devices 25 are client stations and the communication device 14 is an access point. In other implementations, the communication devices 14, 25 can be referred to with different terminology.

Figure 1B:
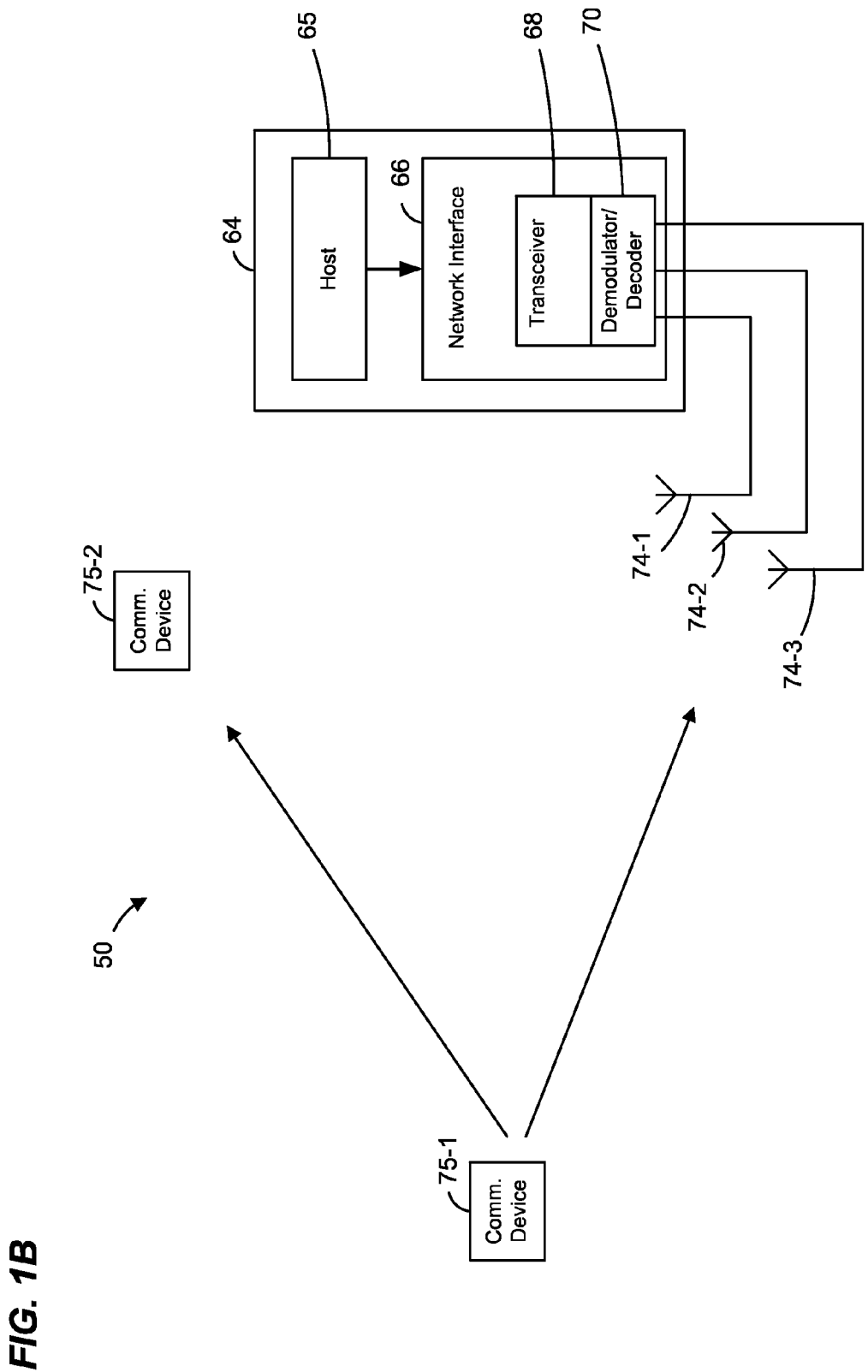
FIG. 1B is a block diagram of another example wireless network, according to another embodiment, in which a communication device utilizes joint demodulation and decoding to mitigate interference.

FIG. 1B is a block diagram of another example wireless network 50, according to an embodiment, in which a communication device 64 utilizes joint demodulation and joint decoding to mitigate interference. The communication device 64 includes a host processor 65 coupled to a network interface 66. The network interface 66 includes a transceiver 68. The transceiver 68 is coupled to a plurality of antennas 74. Although three antennas 74 are illustrated in FIG. 1B, the communication device 64 can include different numbers (e.g., 1, 2, 4, 5, etc.) of antennas 74 in other embodiments. In an embodiment, the transceiver 68 includes a joint demodulator/decoder unit 70. The joint demodulator/decoder unit 70 will be described in further detail below.

The wireless network 50 also includes a plurality of communication devices 75. Although two communication devices 75 are illustrated in FIG. 1B, the wireless network 50 can include different numbers (e.g., 3, 4, 5, 6, etc.) of communication devices 75 in various scenarios and embodiments.

The communication device 75-1 simultaneously, and at the same frequency, transmits different data to the communication device 75-2 and the communication device 64. The signal transmitted by the communication device 75-1 can be thought of as the sum of a first signal carrying data for the communication device 75-2 and a second signal carrying data for the communication device 64. When sum of the first and second signals is received by the communication device 64, the first signal carrying data for the communication device 75-2 acts as interference with respect to the second signal carrying data for the communication device 64. As will be described in more detail below, the joint demodulator/decoder unit 70 jointly demodulates and jointly decodes the signal transmitted by the communication device 75-1 (i.e., the sum of the first signal carrying data for the communication device 75-2 and the second signal carrying data for the communication device 64), according to an embodiment. The demodulator/decoder unit 70 then extracts the data intended for the device 64. This joint demodulation and joint decoding mitigates interference cause by the first signal carrying data for the communication device 75-2 with respect to the second signal carrying data for the communication device 64.

In some embodiments, the system 50 includes one or more communication devices 75-3, 75-4, etc., and the communication device 75-1 simultaneously, and at the same frequency, transmits different data to the communication devices 75-2, 75-3, 75-4, etc., and the communication device 64. The joint demodulator/decoder unit 70 jointly demodulates and jointly decodes the signal transmitted by the communication device 75-1 (i.e., a sum of a first signal carrying data for the communication device 64, a second signal carrying data for the communication device 75-2, a third signal carrying data for the communication device 75-3, etc.), according to some embodiments. The demodulator/decoder unit 70 then extracts the data intended for the device 64.

In an implementation in which the network 50 adheres to the LTE standard of 3GPP, the communication devices 75-2 and 64 are or include user equipment and the communication device 75-1 is or includes an evolved node B. In an implementation in which the network 50 is a WiMAX network, the communication devices 75-2 and 64 are mobile stations and the communication device 75-1 is a base station. In an implementation in which the network 50 is a WLAN, the communication devices 75-2 and 64 are client stations and the communication device 75-1 is an access point. In other implementations, the communication devices 64, 75 can be referred to with different terminology.

Figure 1C:
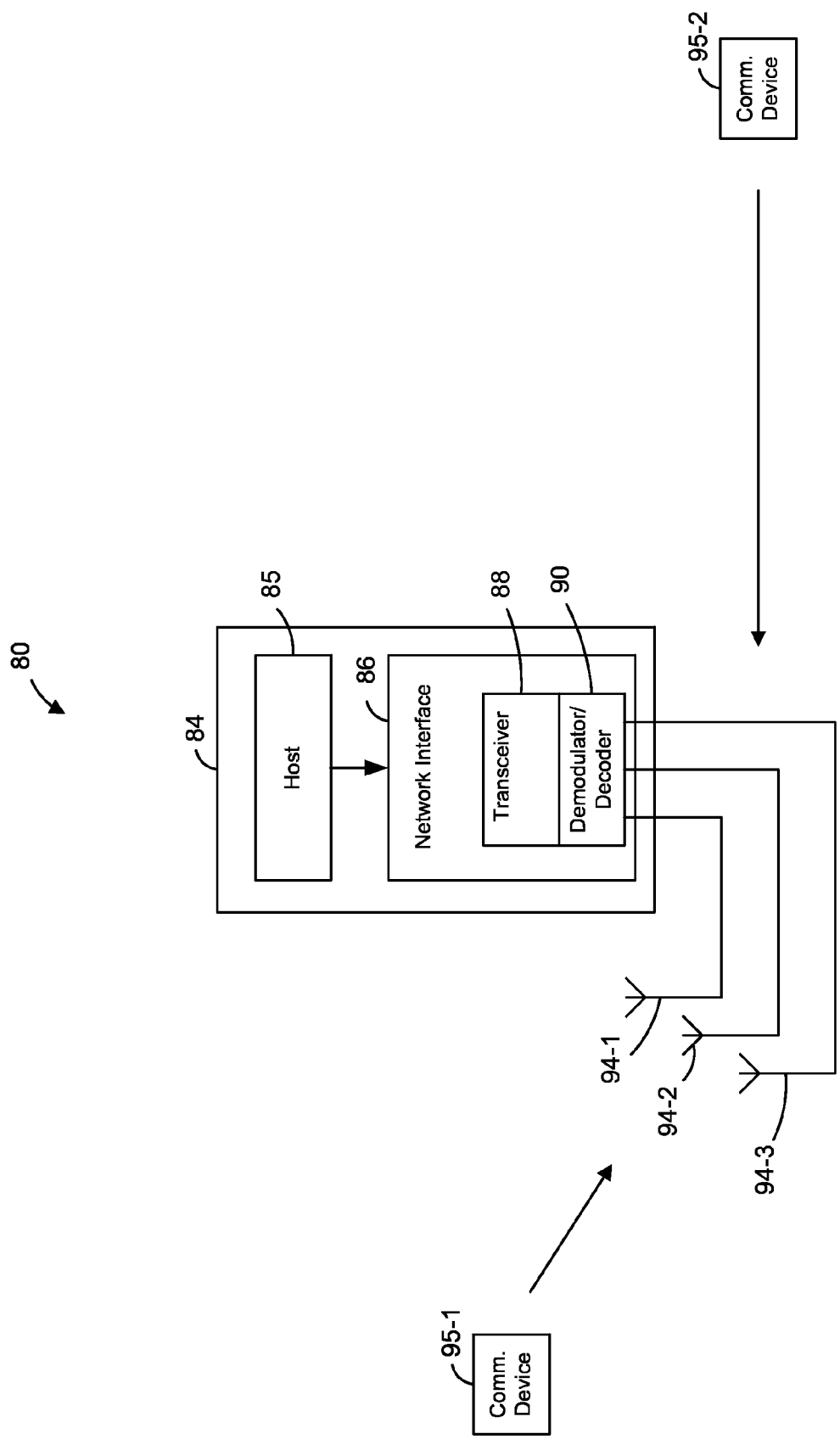
FIG. 1C is a block diagram of another example wireless network, according to another embodiment, in which a communication device utilizes joint demodulation and decoding to mitigate interference.

FIG. 1C is a block diagram of an example wireless network 80, according to an embodiment, in which a communication device 84 utilizes joint demodulation and joint decoding to mitigate interference. The communication device 84 includes a host processor 85 coupled to a network interface 86. The network interface 86 includes a transceiver 88. The transceiver 88 is coupled to a plurality of antennas 94. Although three antennas 94 are illustrated in FIG. 1C, the communication device 84 can include different numbers (e.g., 1, 2, 4, 5, etc.) of antennas 94 in other embodiments. In an embodiment, the transceiver 88 includes a joint demodulator/decoder unit 90. The joint demodulator/decoder unit 90 will be described in further detail below.

The wireless network 80 also includes a plurality of communication devices 95. Although two communication devices 95 are illustrated in FIG. 1C, the wireless network 80 can include different numbers (e.g., 3, 4, 5, 6, etc.) of communication devices 95 in various scenarios and embodiments.

Each communication device 95 simultaneously, and at the same frequency, transmits data that is received by the communication device 84. As a result, a signal transmitted by the communication device 95-2 acts as interference with respect to a signal transmitted by the communication device 95-1. As will be described in more detail below, the joint demodulator/decoder unit 90 jointly demodulates and jointly decodes the signal transmitted by the communication device 95-1 and the signal transmitted by the communication device 95-2, according to an embodiment. This joint demodulation and joint decoding mitigates interference caused by the signal transmitted by the communication device 95-2 with respect to the signal transmitted by the communication device 95-1. In some embodiments, more than two communication devices 95 simultaneously, and at the same frequency, transmit data that is received by the communication device 84 resulting in similar interference. The joint demodulator/decoder unit 90 jointly demodulates and jointly decodes the signals transmitted by the more than two communication devices 95, according to some embodiments.

In an implementation in which the network 80 adheres to the LTE standard of 3GPP, the communication devices 95 are evolved nodes B and the communication device 84 is or includes user equipment. For example, in one scenario, the user equipment 84 is within the cell of and associated with the evolved node B 95-1, whereas the evolved node B 95-2 is in an adjacent cell and is an interferer from the standpoint of the user equipment 84. In an implementation in which the network 80 is a WiMAX network, the communication devices 95 are base stations and the communication device 84 is a mobile station. For example, in one scenario, the mobile station 84 is within the cell of and associated with the base station 95-1, whereas the base station 95-2 is in an adjacent cell and is an interferer from the standpoint of the mobile station 84. In an implementation in which the network 80 is a WLAN, the communication devices 95 are access points and the communication device 84 is a client station. For example, in one scenario, the client station 84 is within the coverage area of and associated with the access point 95-1, whereas the access point 95-2 is an interferer from the standpoint of the client station 84. In other implementations, the communication devices 84, 95 can be referred to with different terminology.

Although FIGS. 1A, 1B, and 1C illustrate wireless communication networks, in other embodiments wired communication networks such as a cable television networks include communication devices similar to communication devices 14, 25, 64, 75, 84, and 95, and in arrangements similar to the networks 10, 50, and 80. For example, referring to FIG. 1A, devices similar to the devices 25 are, or are included in, cable modems, set top boxes televisions, etc., and a device similar to the device 14 is located at a cable television head end, in one embodiment. In this embodiment, a plurality of cable modems, set top boxes televisions, etc., simultaneously, and at the same frequency, transmit different data to the head end over a shared communication medium, such as a wired cable network. Referring to FIG. 1B, as another example, devices similar to the devices 64 and 75-2 are, or are included in, cable modems, set top boxes, televisions, etc., and a device similar to the device 75-1 is located at a cable television head end, in one embodiment. In this embodiment, a device at the head end simultaneously, and at the same frequency, transmits different data to a plurality of cable modems, set top boxes televisions, etc., over a shared communication medium, such as a wired cable network.

Figure 2:
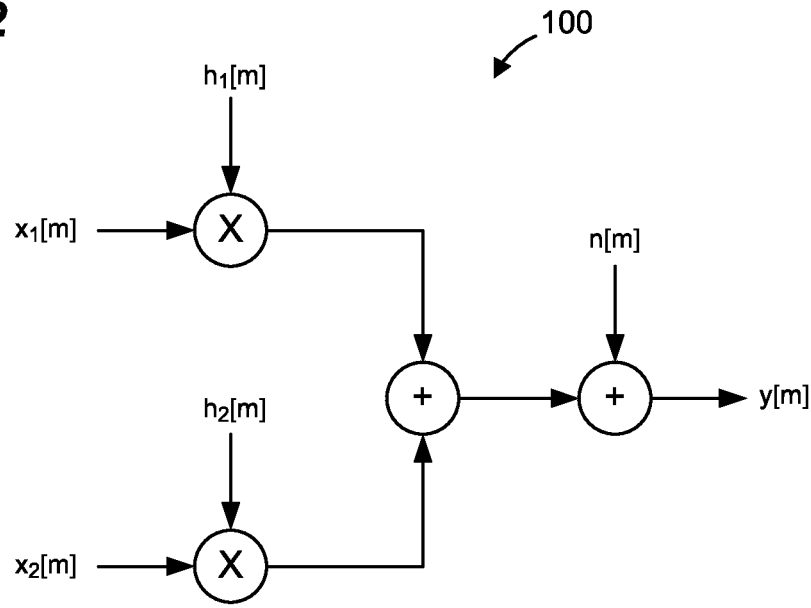
FIG. 2 is a block diagram of an example system model corresponding to systems such as the system of FIG. 1A.

Prior to discussing the joint demodulator/decoder units 20, 70, 90 in more detail, an example system model will be described to aid in explanation of the joint demodulator/decoder units 20, 70, 90. FIG. 2 is a block diagram of an example system model 100 corresponding to systems such as the system 10 of FIG. 1A, in which a plurality of communication devices (transmitters) simultaneously, and at the same frequency, transmit different data to a further communication device (receiver). FIG. 2 will be described with reference to FIG. 1A for ease of explanation, but the system model 100 is not limited to the system 10 of FIG. 1A. Moreover, although the example system model 100 includes two transmitters, the system model 100 can be extended to three or more transmitters by one of ordinary skill in the art in view of the disclosure and teachings herein.

A first communication device (e.g., device 25-1) transmits a signal $x_1[m]$ with a transmit power of $P_1[m]$, where m is a time index. A second communication device (e.g., device 25-2) transmits a signal $x_2[m]$ with a transmit power of $P_2[m]$.

The signals $x_1[m]$ and $x_2[m]$ are sometimes referred to herein as user signals and as $x_k[m]$, where k is an index indicating the k-th user. In some embodiments, k is greater than two (i.e., there can be three or more transmitters). The signal received by a third communication device (e.g., device 14) can be represented by:

$$y[m]=h_1[m]x_1[m]+h_2[m]x_2[m]+n[m] \qquad \text{Equ. 1}$$

where $h_1[m]$ is a channel gain from the first communication device (e.g., device 25-1) to the third communication device (e.g., device 14), $h_2[m]$ is a channel gain from the second communication device (e.g., device 25-2) to the third communication device (e.g., device 14), and n[m] is a suitable model of noise, such as independent identically distributed Gaussian noise with mean zero and a variance $\sigma^{-2}$. The channel gains $h_1[m]$ and $h_2[m]$ are sometimes referred to herein as $h_k[m]$, where k indicates the channel gain from the k-th user to the receiver.

Figure 3:
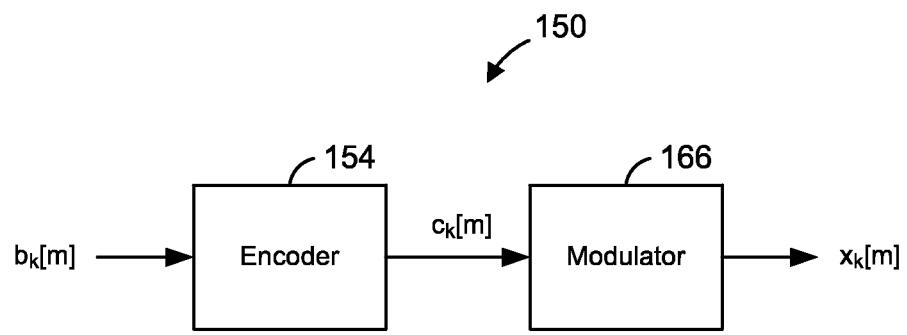
FIG. 3 is a block diagram of a prior art encoding and modulating unit.

FIG. 3 is a block diagram of an example prior art encoder/modulator system 150 that generates the k-th user signal $x_k[m]$ of FIG. 2. Thus, each device 25 (FIG. 1A) includes an encoder/modulator system the same as or similar to the encoder/modulator system 150, in an embodiment. In other embodiments, one or both devices 25 include a suitable encoder/modulator system different than the encoder/modulator system 150. In some embodiments, one or more of the devices does not encode data, in at least some scenarios. Thus, in some embodiments and/or scenarios, a device 25 does not include the encoder 154 and/or does not encode data prior to modulation.

The system 150 includes an encoder 154 that encodes user data $b_k[m]$ to generate encoded user data $c_k[m]$. In one embodiment, $b_k[m]$ is a vector of information bits of size K for the k-th user, and $c_k[m]$ is a vector of encoded bits of size V for the k-th user. In some embodiments, the encoder 154 is a convolutional encoder and utilizes a convolutional encoding scheme. In some embodiments, the encoder 154 is a Trellis encoder. In one embodiment, the encoder 154 comprises a finite-state machine and is characterized by a finite state transition diagram or a trellis diagram. FIG. 4A is an example trellis diagram 158 corresponding to a convolutional encoder or Trellis encoder for generating encoded user data $c_1[m]$ based on user data $b_1[m]$. The trellis diagram 158 corresponds to an encoder having $S_1$ states. In the example 158, one output bit $o_1$ is generated for each input bit $i_1$. FIG. 4B is an example trellis diagram 162 corresponding to a convolutional encoder or a Trellis encoder for generating encoded user data $c_2[m]$ based on user data $b_2[m]$. The trellis diagram 162 corresponds to an encoder having $S_2$ states. In the example 162, one output bit $o_2$ is generated for each input bit $i_2$.

Referring again to FIG. 3, a modulator 166 modulates the encoded user data $c_k[m]$ to generate the k-th user signal $x_k[m]$. In one embodiment, the modulator 166 is a quadrature amplitude modulation (QAM) modulator. FIG. 5 is a diagram of an example QAM constellation illustrating operation of the modulator 166, in one embodiment. In the example of FIG. 5, the modulator 166 maps each pair of encoded user bits to one of four transmit symbols 170, 174, 178, 182. In other embodiments, a different size constellation is utilized, i.e., the modulator 166 maps encoded user bits to a number of transmit symbols other than four, such as 8, 16, 64, 128, etc. Moreover, in other embodiments, a modulation other than QAM is used, such as vestigial sideband modulation (VSB), etc.

Figure 6:
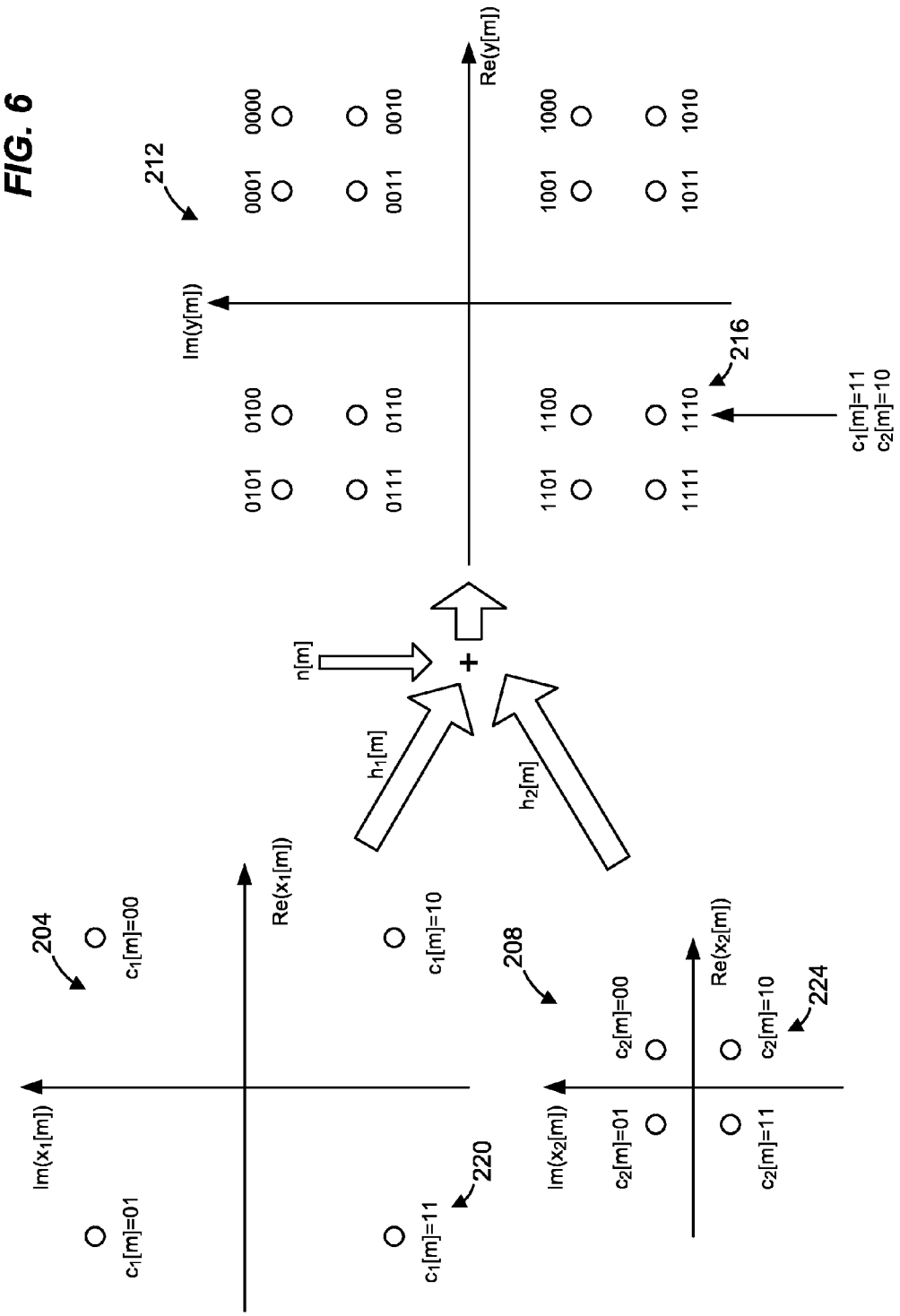
FIG. 6 is a diagram illustrating an example in which quadrature amplitude modulation (QAM) transmit symbols are transmitted simultaneously, and at the same frequency, by two communication devices to a third communication device.

FIG. 6 is a diagram illustrating an example in which QAM transmit symbols are transmitted simultaneously, and at the same frequency, by two communication devices (i.e., first and second communication devices) to a third communication device. In other embodiments, different constellations, different numbers of transmit symbols, and/or non-QAM modulation is utilized. FIG. 6 is described with reference to FIG. 1A for ease of explanation. In FIG. 6, it is assumed that the power of the signal corresponding to the first user (communication device 25-1) is relatively strong compared to the power of the signal corresponding to the second user (communication device 25-2). For example, in one scenario, the communication device 25-1 is closer to the communication device 14 as compared to the distance between the communication device 25-2 and the communication device 14 and/or the communication device 25-1 transmits at a higher power than the communication device 25-2.

In the example of FIG. 6, both of the communication device 25-1 and the communication device 25-2 utilize 4-QAM modulation (also referred to as quadrature phase-shift keying (QPSK)). Thus, each of the communication device 25-1 and the communication device 25-2 includes a respective modulator that maps encoded data to four transmit symbols. The modulator of the communication device 25-1 maps encoded data to transmit symbols according to the constellation diagram 204 and the modulator of the communication device 25-2 maps encoded data to transmit symbols according to the constellation diagram 208. The transmit symbols in the constellation 204 are illustrated farther from the origin as compared to the transmit symbols in the constellation 208 to indicate the higher power of the signal corresponding to the first user (communication device 25-1) as compared to the power of the signal corresponding to the second user (communication device 25-2).

When the signals transmitted by the communication device 25-1 and the communication device 25-2 are transmitted simultaneously and are received by the communication device 14, the individual transmit symbols form joint transmit symbols having a constellation such as the constellation 212, in an ideal environment (e.g., no noise, etc). The received constellation 212 includes 16 constellation points corresponding to 16 joint transmit symbols. Each constellation point and each joint transmit symbol corresponds to data from both the communication device 25-1 and the communication device 25-2. For example, the constellation point 216 corresponds to $c_1[m]=11$ and $c_2[m]=10$. Constellation points in the constellation 212 are sometimes referred to as expected joint symbol values. For instance, when the communication device 25-1 transmits the transmit symbol 220 and the communication device 25-2 simultaneously transmits the transmit symbol 224, it is expected that the communication device 14 will receive a joint symbol corresponding to the constellation point 216. But because of noise and other factors, the received joint transmit symbol typically will not be located exactly at the position of the constellation point 216.

Generally, because of noise and other factors, a received joint transmit symbol typically will not align exactly with the correct constellation point in the constellation 212. As will be described in more detail below, a joint demodulator of the communication device 14 determines distances between a received joint transmit symbol and each of at least some of the constellation points in the constellation diagram 212. The determined distances are utilized to determine to which constellation point (or expected joint symbol value) a received joint transmit symbol corresponds.

In a system such as the system 10 (FIG. 1A), the transceiver 18 of the communication device 14 knows the modulation coding scheme (MCS) used by the communication device 25-1 and the MCS used by the communication device 25-2. Thus, the demodulator/decoder unit 20 can determine the joint constellation 212 (FIG. 6) and utilize it to perform joint demodulation and joint decoding, as will be discussed below.

Figure 7:
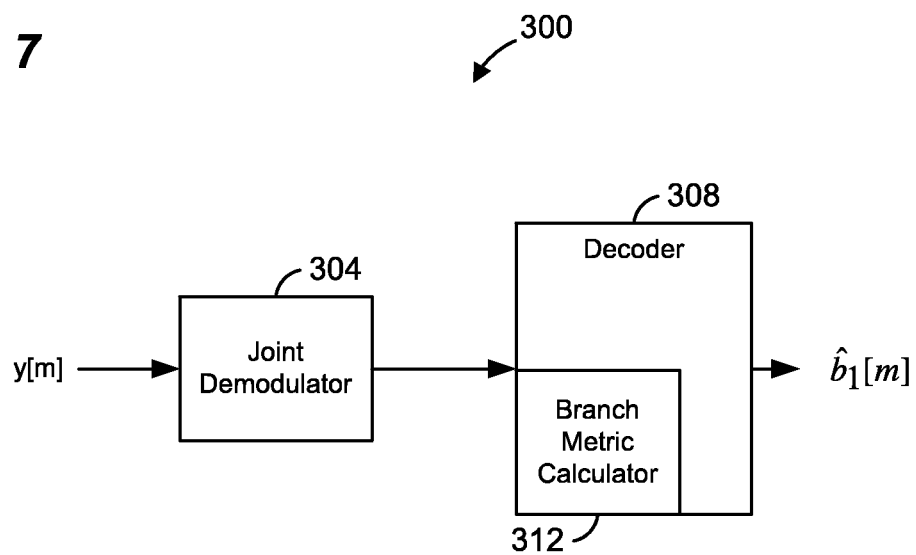
FIG. 7 is a block diagram of an example joint demodulation/decoding unit, according to an embodiment.

FIG. 7 is a block diagram of an example joint demodulator/decoder unit 300, according to an embodiment. The joint demodulator/decoder unit 300 is utilized as the joint demodulator/decoder unit 20 of FIG. 1A in one embodiment. In other embodiments, a joint demodulator/decoder unit different than the joint demodulator/decoder unit 300 is utilized as the joint demodulator/decoder unit 20 of FIG. 1A.

The joint demodulator/decoder unit 300 will be described with reference to FIG. 6 for ease of explanation. In some embodiments, the joint demodulator/decoder unit 300 utilizes a constellation different than the constellation 212 of FIG. 6 or utilizes non-QAM demodulation, such as VSB demodulation.

The joint demodulator/decoder unit 300 includes a joint demodulator 304 coupled to a decoder 308. The joint demodulator 304 determines distances between a received joint transmit symbol and at least some constellation points (or expected joint symbol values). In one embodiment, a determined distance between a received signal y[m] and a constellation point is represented as:

$$\|y[m] - (h_1[m]x_1[m] + h_2[m]x_2[m])\|^2 \quad \text{Equ. 2}$$

where $h_1[m]x_1[m] + h_2[m]x_2[m]$ corresponds to the constellation point corresponding to a particular tuple of a transmit symbol $x_1[m]$ from the communication device 25-1 and a transmit symbol $x_2[m]$ from the communication device 25-2.

In one embodiment, the joint demodulator 304 determines the constellation points such as in the example constellation 212 (FIG. 6) based on modulation information for the first user signal and the second user signal. For instance, referring to FIG. 1A, in one embodiment, the communication device 25-1 transmits to the communication device 14 an indication of the MCS the communication device 25-1 will utilize to transmit to the communication device 14. In this embodiment, the communication device 25-2 similarly transmits to the communication device 14 an indication of the MCS the communication device 25-2 will utilize to transmit to the communication device 14. Using the MCS information, the joint demodulator/decoder unit 20 can determine the constellation points in the joint constellation, such as the example joint constellation 212 of FIG. 6.

The determined distances are provided to the decoder 308, which utilizes the determined distances to make decisions regarding the decoded user data to which the transmit symbol $x_1[m]$ from the communication device 25-1 corresponds. The decoder 308 includes a finite state machine having a number of states equal to $S_1$, where $S_1$ is the number of states employed by the corresponding encoder 154 at the communication device corresponding to the first user. In embodiments in which a device 25 corresponding to a k-th user does not include an encoder or does not implement encoding, the device 25 is considered to have an encoder with only one state (i.e., $S_k=i$).

Figure 8:
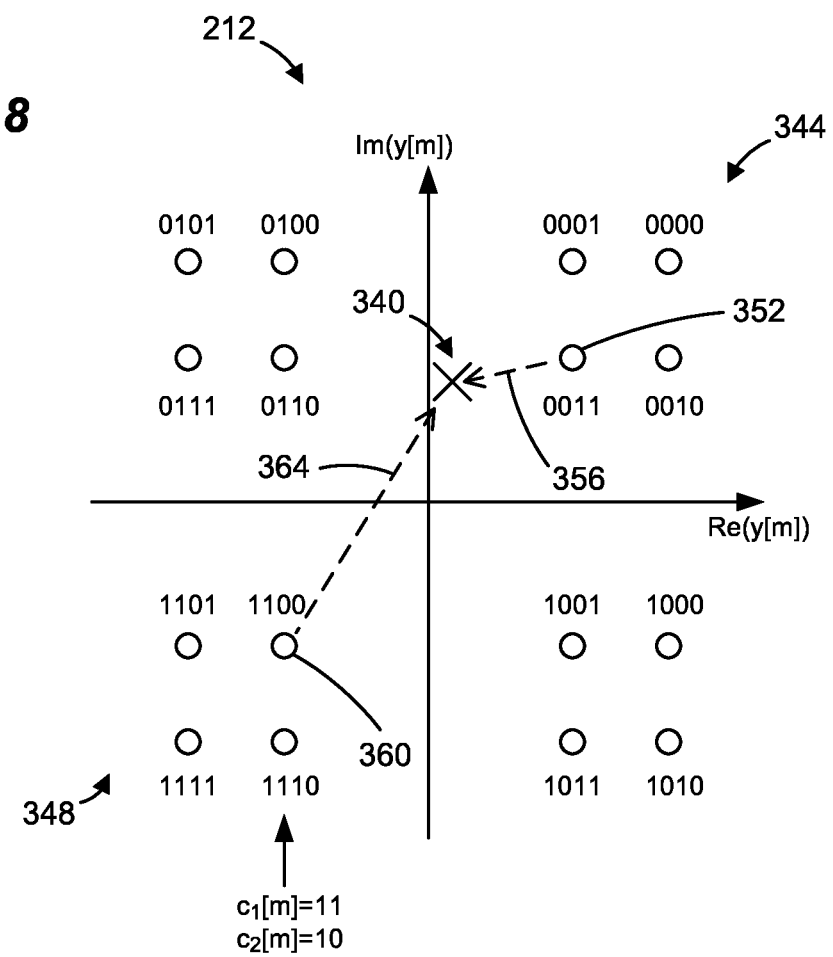
FIG. 8 is a joint trellis that can be utilized by the joint demodulation/decoding unit of FIG. 7, according to an embodiment.

In an embodiment, the finite state machine of the decoder 308 is represented as a trellis such as the trellis 158 of FIG. 4A. The decoder 308 includes a branch metric calculator 312 that calculates branch metrics corresponding to allowed branches in the trellis. The branch metrics are calculated using the determined distances from the joint demodulator 304. FIG. 8 is a diagram including the example constellation 212 of FIG. 6 and showing a received symbol 340 (illustrated as an "X") and corresponding to the transmit symbol $x_1[m]$ and the transmit symbol $x_2[m]$. As an example, a first allowed branch of the trellis for the transmit symbol $x_1[m]$ corresponds to encoded user data $c_1[m]=00$, and a second allowed branch of the trellis for the transmit symbol $x_1[m]$ corresponds to encoded user data $c_1[m]=11$. The first allowed branch corresponds to the upper-right quadrant 344 of the constellation 212, and the second allowed branch corresponds to the lower-left quadrant 348 of the constellation 212.

In one embodiment, the branch metric calculator 312 is configured to calculate a branch metric, with respect to the transmit symbol $x_1[m]$, according to:

$$\min_{x_2 \in M_2} \|y[m] - (h_1[m]x_1[m] + h_2[m]x_2[m])\|^2 \quad \text{Equ. 3}$$

where $M_2$ corresponds to the set of all possible values of $x_2$. The branch metric of Equ. 3 generally corresponds to the minimum distance for all possible values of $x_2$. For instance, the first allowed branch corresponds to the upper-right quadrant 344 of the constellation 212. For all of the possible values of $x_2$ in the quadrant 344, the constellation point with the minimum distance to the received symbol 340 is constellation point 352, and the branch metric corresponding to the first allowed branch is indicated by the line 356. Similarly, the second allowed branch corresponds to the lower-left quadrant 348 of the constellation 212. For all of the possible values of $x_2$ in the quadrant 348, the constellation point with the minimum distance to the received symbol 340 is constellation point 360, and the branch metric corresponding to the second allowed branch is indicated by the line 364.

In another embodiment, the branch metric calculator 312 is configured to calculate a branch metric, with respect to the transmit symbol $x_1[m]$, according to:

$$\sum_{x_2 \in M_2} e^{-\frac{\|y[m] - (h_1[m]x_1[m] + h_2[m]x_2[m])\|^2}{2\sigma^2}} \quad \text{Equ. 4}$$

where $\sigma^{-2}$ corresponds to the variance of additive Gaussian noise. The branch metric of Equ. 4 generally corresponds to a sum of exponentials of distances for all possible values of $x_2$. For instance, the first allowed branch corresponds to the upper-right quadrant 344 of the constellation 212. For the first allowed branch, a branch metric corresponding to Equ. 4 is a sum of exponentials of distances for all constellation points in the quadrant 344 to the received symbol 340. Similarly, the second allowed branch corresponds to the lower-left quadrant 348 of the constellation 212, a branch metric corresponding to Equ. 4 is a sum of exponentials of distances for all constellation points in the quadrant 348 to the received symbol 340.

The decoder 308 utilizes the branch metrics to generate the decoded user data $\hat{b}_1[m]$, corresponding to data transmitted by the communication device 25-1. In one embodiment, the decoder 308 implements maximum likelihood sequence decoding (MLSD) corresponding to the trellis 158. For example, the decoder 308 implements the Viterbi algorithm over the trellis 158, in one embodiment. In some embodiments in which the decoder 308 implements the Viterbi algorithm, the decoder 308 utilizes branch metrics calculated as described above or in another suitable manner.

In another embodiment, the decoder 308 implements a maximum a posteriori (MAP) algorithm over the trellis 158. For example, the decoder 308 implements the BCJR algorithm (Bahl, Cocke, Jelinek, Raviv) over the trellis 158, in one embodiment. In an embodiment in which the decoder 308 implements the BCJR algorithm, the decoder 308 utilizes branch metrics calculated as described above or in another suitable manner.

Figure 9:
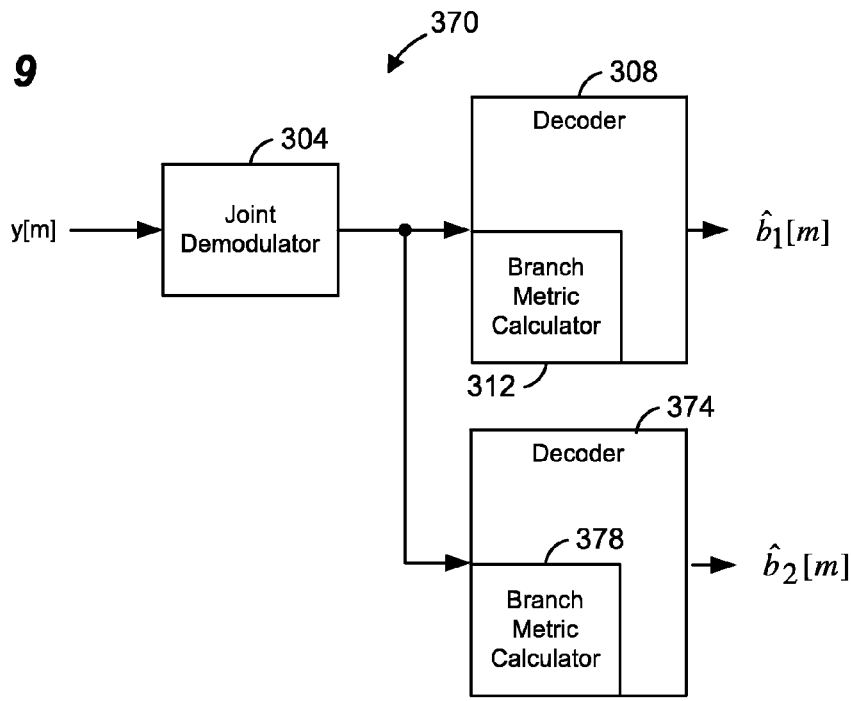
FIG. 9 is a block diagram of another example joint demodulation/decoding unit, according to an embodiment.

The joint demodulator/decoder unit 300 generates the decoded user data $\hat{b}_1[m]$ corresponding to the first user. If decoded user data corresponding to the second user, is needed, an additional decoder can be utilized. FIG. 9 is a block diagram of an example joint demodulator/decoder unit 370, according to an embodiment. The joint demodulator/decoder unit 370 is utilized as the joint demodulator/decoder unit 20 of FIG. 1A in one embodiment. In other embodiments, a joint demodulator/decoder unit different than the joint demodulator/decoder unit 370 is utilized as the joint demodulator/decoder unit 20 of FIG. 1A.

The joint demodulator/decoder unit 370 is similar to the joint demodulator/decoder unit 300 of FIG. 7, and includes like-numbered elements. Additionally, the joint demodulator/decoder unit 370 includes a second decoder 374 to generate decoded user data $\hat{b}_2[m]$ corresponding to the second user. In an embodiment, the decoder 374 is the same as or similar to the decoder unit 308 described above, but configured to decode data corresponding to the second user. In an embodiment, the decoder 374 includes a branch metric calculator 378 that is the same as or similar to the branch metric calculator 312 described above. In another embodiment, the decoder 374 utilizes the branch metric calculator 312.

Figure 10:
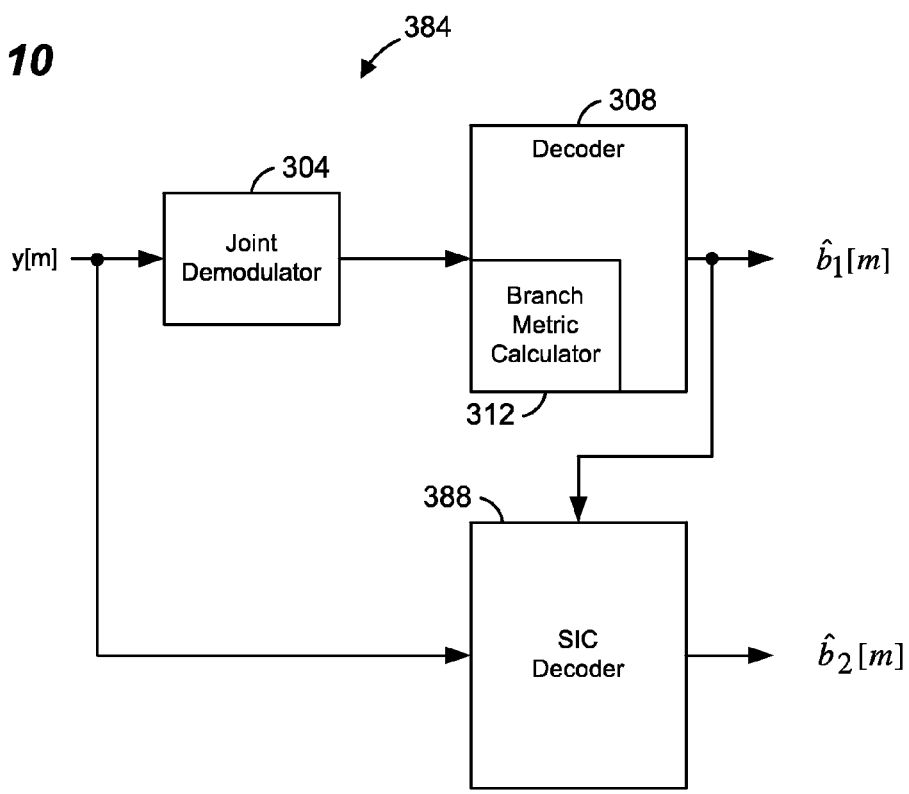
FIG. 10 is a block diagram of another example joint demodulation/decoding unit, according to an embodiment.

FIG. 10 is a block diagram of an example joint demodulator/decoder unit 384, according to an embodiment. The joint demodulator/decoder unit 384 is utilized as the joint demodulator/decoder unit 20 of FIG. 1A in one embodiment. In other embodiments, a joint demodulator/decoder unit different than the joint demodulator/decoder unit 384 is utilized as the joint demodulator/decoder unit 20 of FIG. 1A.

The joint demodulator/decoder unit 384 is similar to the joint demodulator/decoder unit 300 of FIG. 7, and includes like-numbered elements. Additionally, the joint demodulator/decoder unit 384 includes a second decoder 388 to generate decoded user data $\hat{b}_2[m]$ corresponding to the second user. In an embodiment, the decoder 388 is an SIC decoder that utilizes the decoded user data $\hat{b}_1[m]$. In particular, the SIC decoder 388 re-encodes and re-modulates the first user data, and then subtracts the re-encoded, re-modulated first user data from the received signal. Then, the signal is demodulated and decoded to generate decoded user data $\hat{b}_2[m]$ corresponding to the second user.

In at least some embodiments and/or scenarios, a joint demodulation/decoding unit such as described above permits communication devices, such as the communication devices 25 (FIG. 1A) to transmit at less power but achieve comparable performance (e.g., bit error rate, packet error rate, symbol error rate, etc.) as compared to a utilizing a prior art demodulator and decoder.

Figure 11:
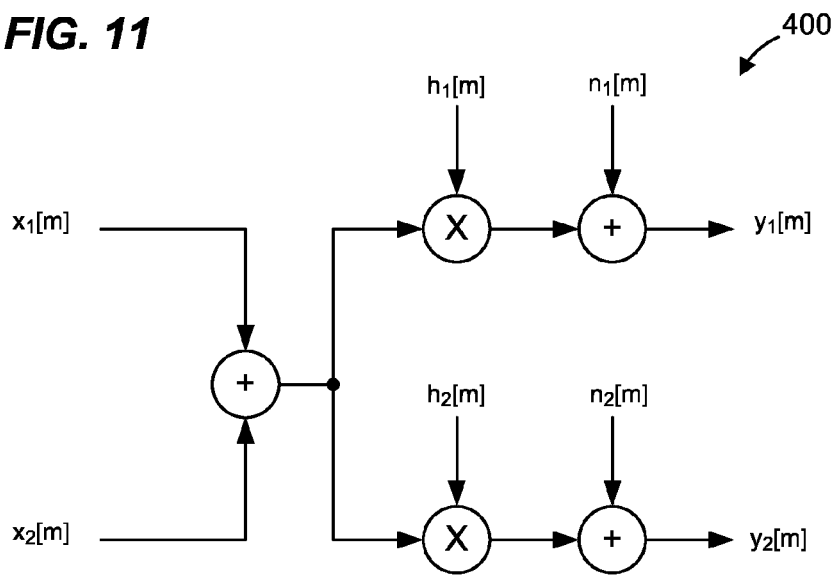
FIG. 11 is a block diagram of an example system model corresponding to systems such as the system of FIG. 1B, in which a communication device (transmitter) transmits different data simultaneously, and at the same frequency, to a plurality of other communication devices (receivers)

FIG. 11 is a block diagram of an example system model 400 corresponding to systems such as the system 50 of FIG. 1B, in which a communication device (transmitter) transmits different data simultaneously, and at the same frequency, to a plurality of other communication devices (receivers). FIG. 11 will be described with reference to FIG. 1B for ease of explanation, but the system model 400 is not limited to the system 50 of FIG. 1B. Moreover, although the example system model 400 includes two receivers, the system model 400 can be extended to three or more receivers by one of ordinary skill in the art in view of the disclosure and teachings herein.

A transmitting communication device (e.g., device 75-1) transmits a signal $x_1[m]$ with a transmit power of $P_1[m]$, where m is a time index. The transmitting communication device (e.g., device 75-1) transmits a signal $x_2[m]$ with a transmit power of $P_2[m]$. The signals $x_1[m]$ and $x_2[m]$ are sometimes referred to herein as user signals and as $x_k[m]$, where k is an index indicating the k-th user. In some embodiments, k is greater than two. The user signals are summed and then the sum is transmitted via different channels to a plurality of receiving communication devices (e.g., device 75-2 and 14). The signal received by the k-th user can be represented by:

$$y_k[m] = h_k[m](x_1[m]+x_2[m]) + n_k[m] \qquad \text{Equ. 5}$$

where $h_k[m]$ is a channel gain from the transmitting communication device (e.g., device 75-1) to the k-th receiving device (e.g., device 75-2 or device 64), and $n_k[m]$ is a suitable model of noise in the channel between the transmitting communication device (e.g., device 75-1) and the k-th receiving device (e.g., device 75-2 or device 64).

Figure 12:
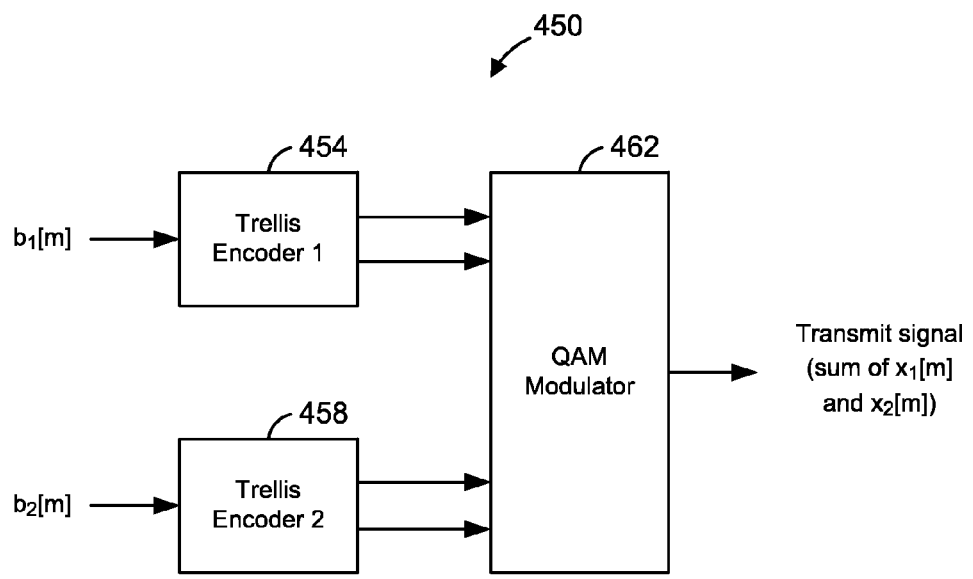
FIG. 12 is a block diagram of an example prior art encoder/modulator system that generates the transmit signal (i.e., the sum of $x_1[m]$ and $x_2[m]$) of FIG. 11.

FIG. 12 is a block diagram of an example prior art encoder/modulator system 450 that generates the transmit signal (i.e., the sum of the first and second user signals $x_1[m]$ and $x_2[m]$) of FIG. 11. Thus, the device 75-1 (FIG. 1B) includes an encoder/modulator system the same as or similar to the encoder/modulator system 450, in an embodiment. In other embodiments, the device 75-1 includes an encoder/modulator system different than the encoder/modulator system 450.

The system 450 includes an encoder 454 that encodes first user data $b_1[m]$ to generate encoded user data. In some embodiments, the encoder 454 is a convolutional encoder and utilizes a convolutional encoding scheme. In some embodiments, the encoder 454 is a Trellis encoder. In one embodiment, the encoder 454 comprises a finite-state machine and is characterized by a finite state transition diagram or a trellis diagram. The system 450 also includes an encoder 458 that encodes second user data $b_2[m]$ to generate encoded user data. In some embodiments, the encoder 458 is a convolutional encoder and utilizes a convolutional encoding scheme. In some embodiments, the encoder 458 is a Trellis encoder. In one embodiment, the encoder 458 comprises a finite-state machine and is characterized by a finite state transition diagram or a trellis diagram.

A modulator 462 modulates the encoded user data from the encoder 454 and the encoded user data from the encoder 458 to generate the sum of the first user signal $x_1[m]$ and the second user data $x_2[m]$. In one embodiment, assuming the first user signal is at a higher power than the second user signal, and assuming the first and second user signals have constellations similar to FIG. 6, the output of the modulator 462 forms a constellation similar to the constellation 212 of FIG. 6. In other embodiments, a different size constellation is utilized. Moreover, in other embodiments, a modulation other than QAM is used, such as vestigial sideband modulation (VSB), etc.

Referring again to FIGS. 1B and 7, the joint demodulator/decoder unit 300 is utilized as the joint demodulator/decoder unit 70 of FIG. 1B in one embodiment. In other embodiments, a suitable joint demodulator/decoder unit different than the joint demodulator/decoder unit 300 is utilized as the joint demodulator/decoder unit 70 of FIG. 1B.

The joint demodulator 304 and the decoder 308 recover the first user data in a manner as discussed above. In particular, the joint demodulator 304 determines distances between a received joint transmit symbol and at least some constellation points (or expected joint symbol values). In one embodiment, a determined distance between a received signal $y_k[m]$ and a constellation point is represented as:

$$\|y_k[m] - h_k[m](x_1[m]+x_2[m])\|^2 \qquad \text{Equ. 6}$$

where k indicates the k-th receive device, $h_k[m](x_1[m]+x_2[m])$ corresponds to the constellation point corresponding to a particular tuple of a transmit symbol $x_1[m]$ intended for the communication device 64 and a transmit symbol $x_2[m]$ intended for the communication device 75-2.

In one embodiment, the joint demodulator 304 determines the constellation points such as in the example constellation 212 (FIG. 6) based on modulation information for the first user signal and the second user signal. For instance, referring to FIG. 1B, in one embodiment the communication device 75-1 transmits to both the communication device 64 and the communication device 75-2 (i.e., broadcasts) an indication of the MCS the communication device 75-1 will utilize to transmit to the communication device 64 and an indication of the MCS the communication device 75-1 will utilize to transmit to the communication device 75-2. Using the MCS information, the joint demodulator/decoder unit 70 can determine the constellation points in the joint constellation, such as the example joint constellation 212 of FIG. 6.

The determined distances are provided to the decoder 308, which utilizes the determined distances to make decisions regarding the decoded first user data to which the joint transmit symbols correspond. As discussed above, the decoder 308 includes a finite state machine having a number of states equal to $S_1$, where $S_1$ is the number of states employed by the corresponding encoder 454 at the transmit communication device 75-1.

In an embodiment, the finite state machine of the decoder 308 is represented as a trellis, such as the example trellis 158 of FIG. 4A. In one embodiment, the decoder 308 calculates branch metrics according to Equ. 3. In another embodiment, the decoder 308 calculates branch metrics according to Equ. 4. In an embodiment, the decoder 308 implements MLSD corresponding to a trellis such as the trellis 158. For example, the decoder 308 implements the Viterbi algorithm over the trellis 158, in one embodiment. In an embodiment in which the decoder 308 implements the Viterbi algorithm, the decoder 308 calculates path metrics utilizing the branch metrics, and utilizes the path metrics to generate the decoded user data $\hat{b}_1[m]$, corresponding to data intended for the communication device 64.

In another embodiment, the decoder 308 implements a MAP algorithm over the trellis 158. For example, the decoder 308 implements the BCJR algorithm over the trellis 158, in one embodiment. In an embodiment in which the decoder 308 implements the BCJR algorithm, the decoder 308 carries out forward and backward recursion utilizing the branch metrics, and utilizes the forward and backward recursion to generate the decoded user data $\hat{b}_1[m]$.

Referring now to FIG. 1B, in an embodiment, the communication device 75-2 has the same or a similar structure as the communication device 64. In this embodiment, the communication device 75-2 includes a joint demodulator/decoding unit 300, but where the decoder 308 decodes the second user data intended for the communication device 75-2. For example, the decoder 308 includes a finite state machine having a number of states equal to $S_2$, where $S_2$ is the number of states employed by the corresponding encoder 458 at the transmit communication device 75-1. In an embodiment, the finite state machine of the decoder 308 is represented as a trellis, such as the example trellis 162 of FIG. 4B.

Referring now to FIGS. 1C, 2, and 3, the system 80 can be modeled in a manner similar to the system 10 of FIG. 1A. For instance, a first communication device (e.g., device 95-1) transmits a signal $x_1[m]$ with a transmit power of $P_1[m]$, where m is a time index. A second communication device (e.g., device 95-2) transmits a signal $x_2[m]$ with a transmit power of $P_2[m]$. The signal received by a third communication device (e.g., device 84) can be represented by Equ. 1, where $h_1[m]$ is a channel gain from the first communication device (e.g., device 95-1) to the third communication device (e.g., device 84), $h_2[m]$ is a channel gain from the second communication device (e.g., device 95-2) to the third communication device (e.g., device 84), and n[m] is a suitable model of noise, such as independent identically distributed Gaussian noise with mean zero and a variance $\sigma^2$. Each device 95 (FIG. 1C) includes an encoder/modulator system the same as or similar to the encoder/modulator system 150 (FIG. 3), in an embodiment. In other embodiments, one or both devices 95 include a suitable encoder/modulator system different than the encoder/modulator system 150. In some embodiments, one or more of the devices do not encode data, in at least some scenarios. Thus, in some embodiments and/or scenarios, a device 95 does not include the encoder 154 and/or does not encode data prior to modulation.

Referring again to FIGS. 1C and 7, the joint demodulator/decoder unit 300 is utilized as the joint demodulator/decoder unit 90 of FIG. 1C in one embodiment. In other embodiments, a suitable joint demodulator/decoder unit different than the joint demodulator/decoder unit 300 is utilized as the joint demodulator/decoder unit 90 of FIG. 1C. The joint demodulator 304 and the decoder 308 recover the first user data (e.g., from device 95-1) in a manner as discussed above.

Figure 13:
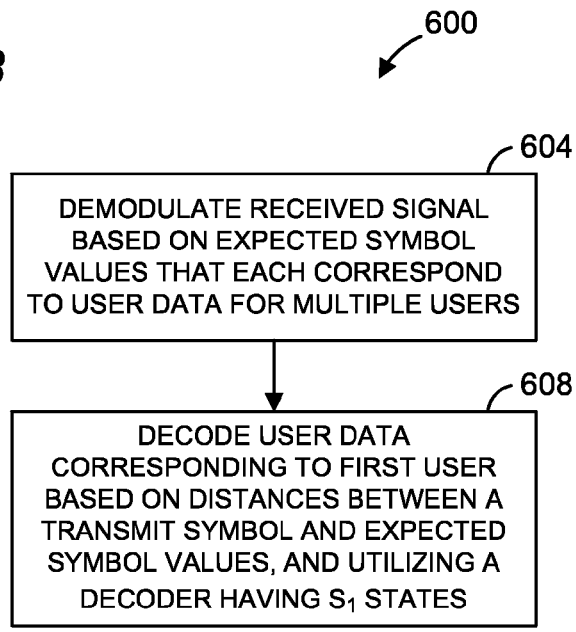
FIG. 13 is a flow diagram of an example method for processing a received signal that includes a plurality of user signals, according to an embodiment.

FIG. 13 is a flow diagram of an example method 600 for processing a received signal that includes a plurality of user signals including at least a first user signal and a second user signal. The first user signal corresponds to first user data that has been modulated independently of second user data corresponding to the second user signal. In various embodiments, the method 600 is implemented by the joint demodulation/decoding unit 20, the joint demodulation/decoding unit 70, the joint demodulation/decoding unit 90, the joint demodulation/decoding unit 300, the joint demodulation/decoding unit 370, and/or the joint demodulation/decoding unit 384. In other embodiments, the method 600 is implemented by a suitable joint demodulation/decoding unit other than the joint demodulation/decoding unit 20, the joint demodulation/decoding unit 70, the joint demodulation/decoding unit 300, the joint demodulation/decoding unit 370, and/or the joint demodulation/decoding unit 384.

At block 604, the received signal is demodulated based on expected symbol values, wherein each expected symbol value corresponds to user data for multiple users. Referring to FIG. 6, for example, each constellation point (expected symbol value) corresponds to both first user data and second user data. The first user data has been convolutionally and/or trellis encoded, independently of the other user signals, using a state machine having $S_1$ states, and the second user data has been convolutionally and/or trellis encoded, independently of the other user signals, using a state machine having $S_2$ states.

At block 608, the first user data is decoded based on determined distances between a transmit symbol in the received signal and the expected symbol values, and utilizing a decoder having $S_1$ states.

Figure 14:
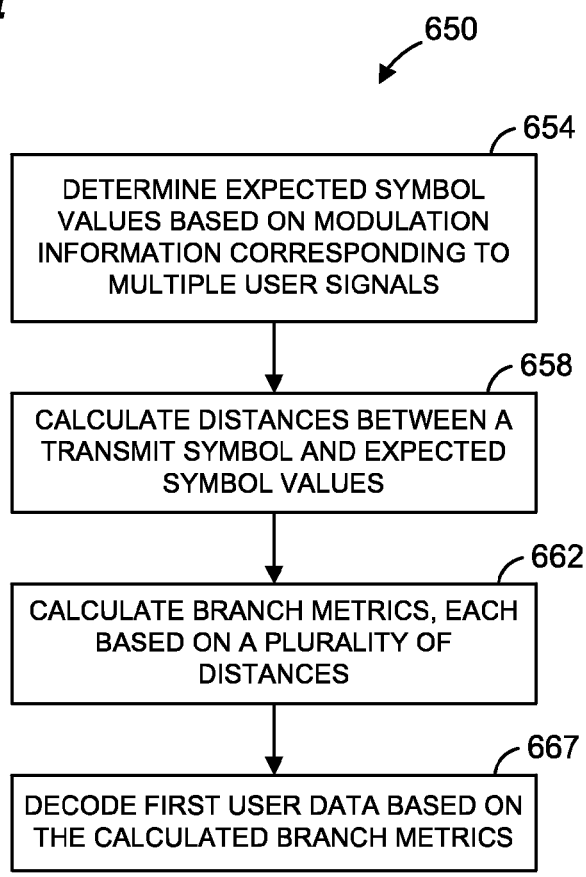
FIG. 14 is a flow diagram of another example method for processing a received signal that includes a plurality of user signals, according to an embodiment.

FIG. 14 is a flow diagram of another example method 650 for processing a received signal that includes a plurality of user signals including at least a first user signal and a second user signal. The first user signal corresponds to first user data that has been modulated independently of second user data corresponding to the second user signal. The first user data has been convolutionally and/or trellis encoded, independently of the other user signals, using a state machine having $S_1$ states, and the second user data has been convolutionally and/or trellis encoded, independently of the other user signals, using a state machine having $S_2$ states.

In various embodiments, the method 650 is implemented by the joint demodulation/decoding unit 20, the joint demodulation/decoding unit 70, the joint demodulation/decoding unit 300, the joint demodulation/decoding unit 370, and/or the joint demodulation/decoding unit 384. In other embodiments, the method 650 is implemented by a suitable joint demodulation/decoding unit other than the joint demodulation/decoding unit 20, the joint demodulation/decoding unit 70, the joint demodulation/decoding unit 300, the joint demodulation/decoding unit 370, and/or the joint demodulation/decoding unit 384.

At block 654, each expected symbol value is determined based on modulation information corresponding to multiple user signals, and each expected symbol value corresponds to user data for multiple users. Referring to FIG. 6, for example, each constellation point (expected symbol value) corresponds to both first user data and second user data, and a joint demodulation/decoding unit determines the constellation points based on MCS information corresponding to the first user signal and the second user signal.

At block 658, distances between a transmit symbol in the received signal and the expected symbol values are determined. Referring to FIG. 6, for example, distances between a received transmit symbol and each of at least some of the constellation points (expected symbol values) in the constellation 212 are calculated.

At block 662, branch metrics for the first user data are calculated, and each branch metric is calculated based on a respective plurality of the distances calculated at block 658. For example, a branch metric is calculated according to Equ. 3, in one embodiment. As another example, a branch metric is calculated according to Equ. 4, in another embodiment.

At block 667, first user data is decoded based on the branch metrics calculated at block 662.

At least some of the various blocks, operations, and techniques described above may be implemented utilizing hardware, a processor executing firmware instructions, a processor executing software instructions, or any combination thereof. When implemented utilizing a processor executing software or firmware instructions, the software or firmware instructions may be stored in any computer readable memory such as on a magnetic disk, an optical disk, or other storage medium, in a RAM or ROM or flash memory, processor, hard disk drive, optical disk drive, tape drive, etc. Likewise, the software or firmware instructions may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software or firmware instructions may be delivered to a user or a system via a communication channel such as a telephone line, a DSL line, a cable television line, a fiber optics line, a wireless communication channel, the Internet, etc. (which are viewed as being the same as or interchangeable with providing such software via a transportable storage medium). The software or firmware instructions may include machine readable instructions that, when executed by the processor, cause the processor to perform various acts.

When implemented in hardware, the hardware may comprise one or more of discrete components, an integrated circuit, an application-specific integrated circuit (ASIC), a field programmable gate array (FPGA), a complex programmable logic device (CPLD), etc.

While the present invention has been described with reference to specific examples, which are intended to be illustrative only and not to be limiting of the invention, changes, additions and/or deletions may be made to the disclosed embodiments without departing from the scope of the invention.

What is claimed is:

1. A method comprising:
    demodulating a received signal that includes a plurality of user signals, the plurality of user signals including at least (i) a first user signal corresponding to a first user and (ii) a second user signal corresponding to a second user, wherein
        the first user signal corresponds to first user data that has been modulated independently of second user data corresponding to the second user signal,
        the first user signal is encoded with a first finite state machine encoder independently of the second user signal,
        the first finite state machine encoder has a number of states $S_1$,
        the second user signal is encoded with a second finite state machine encoder independently of the first user signal,
        the second finite state machine encoder has a number of states $S_2$, and
        demodulating the received signal includes calculating distances between (i) each transmit symbol in the received signal and (ii) expected symbol values, wherein each expected symbol value corresponds to user data for multiple users including the first user and the second user; and
    decoding the first user data in the received signal based on the calculated distances utilizing a finite state machine decoder having $S_1$ states, wherein decoding the first user data comprises:
        calculating a branch metric corresponding to the first user data based on a minimum distance in a plurality of distances for all possible values corresponding to the second user data, and
        decoding the first user data based on the calculated branch metric.

2. The method according to claim 1, wherein at least one user signal corresponds to user data that has been quadrature amplitude modulated; and
    wherein calculating distances between each transmit symbol in the received signal and the expected symbol values includes calculating distances between (i) each transmit symbol in the received signal and (ii) a plurality of constellation points, wherein each constellation point corresponds to the user data for multiple users including the first user and the second user.

3. The method according to claim 1, wherein the first user data is encoded with a Trellis encoder;
    wherein decoding the first user data includes utilizing a Viterbi decoder.

4. The method according to claim 1, wherein the first user signal is transmitted by a first communication device, and the second user signal is transmitted by a second communication device.

5. The method according to claim 1, wherein the first user signal and the second user signal are generated by a first communication device; and wherein the first user signal includes data intended for a second communication device, and wherein the second user signal includes data intended for a third communication device.

6. A method comprising:

demodulating a received signal that includes a plurality of user signals, the plurality of user signals including at least (i) a first user signal corresponding to a first user and (ii) a second user signal corresponding to a second user, wherein the first user signal corresponds to first user data that has been modulated independently of second user data corresponding to the second user signal, the first user signal is encoded with a first finite state machine encoder independently of the second user signal, the first finite state machine encoder has a number of states $S_1$, the second user signal is encoded with a second finite state machine encoder independently of the first user signal, the second finite state machine encoder has a number of states $S_2$, and demodulating the received signal includes calculating distances between (i) each transmit symbol in the received signal and (ii) expected symbol values, wherein each expected symbol value corresponds to user data for multiple users including the first user and the second user; and decoding the first user data in the received signal based on the calculated distances utilizing a finite state machine decoder having $S_1$ states, wherein decoding the first user data comprises:

calculating a branch metric corresponding to the first user data based on a sum of exponentials of a plurality of distances for all possible values corresponding to the second user data, and decoding the first user data based on the calculated branch metric.

7. The method according to claim 6, wherein at least one user signal corresponds to the user data that has been quadrature amplitude modulated; and wherein calculating distances between each transmit symbol in the received signal and the expected symbol values includes calculating distances between (i) each transmit symbol in the received signal and (ii) a plurality of constellation points, wherein each constellation point corresponds to the user data for multiple users including the first user and the second user.

8. The method according to claim 6, wherein the first user data is encoded with a Trellis encoder;

wherein decoding the first user data includes utilizing a Viterbi decoder.

9. The method according to claim 6, wherein the first user signal is transmitted by a first communication device, and the second user signal is transmitted by a second communication device.

10. The method according to claim 6, wherein the first user signal and the second user signal are generated by a first communication device; and wherein the first user signal includes data intended for a second communication device, and wherein the second user signal includes data intended for a third communication device.

11. An apparatus for demodulating and decoding a received signal that includes a plurality of user signals, the plurality of user signals including at least a first user signal and a second user signal, wherein the first user signal corresponds to first user data that has been modulated independently of second user data corresponding to the second user signal, wherein the first user signal is encoded with a finite state machine encoder independently of the second user signal, wherein the first finite state machine encoder has a number of states $S_1$, the apparatus comprising:

a demodulator to demodulate the received signal based on calculating distances between (i) transmit symbols in the received signal and (ii) expected symbol values, wherein each expected symbol value corresponds to user data for multiple users including the first user data and the second user data; and a decoder having a finite state machine with $S_1$ states, wherein the decoder is configured to decode the first user data based on the calculated distances, the decoder includes a branch metric calculator to calculate a branch metric corresponding to the first user data based on a minimum distance of a plurality of distances for all possible values corresponding to the second user data, and the decoder utilizes the calculated branch metric to decode the first user data.

12. An apparatus according to claim 11, wherein the demodulator is a quadrature amplitude modulation (QAM) demodulator configured to calculate distances between (i) each transmit symbol in the received signal and (ii) a plurality of constellation points, where each constellation point corresponds to the user data for multiple users including the first user and the second user.

13. An apparatus according to claim 11, wherein the decoder is a Viterbi decoder.

14. An apparatus for demodulating and decoding a received signal that includes a plurality of user signals, the plurality of user signals including at least a first user signal and a second user signal, wherein the first user signal corresponds to first user data that has been modulated independently of second user data corresponding to the second user signal, wherein the first user signal is encoded with a finite state machine encoder independently of the second user signal, wherein the first finite state machine encoder has a number of states $S_1$, the apparatus comprising:

a demodulator to demodulate the received signal based on calculating distances between (i) transmit symbols in the received signal and (ii) expected symbol values, wherein each expected symbol value corresponds to user data for multiple users including the first user data and the second user data; and a decoder having a finite state machine with $S_1$ states wherein the decoder is configured to decode the first user data based on the calculated distances, the decoder includes a branch metric calculator to calculate a branch metric corresponding to the first user data based on a sum of exponentials of a plurality of distances for all possible values corresponding to the second user data, and the decoder utilizes the calculated branch metric to decode the first user data.

15. An apparatus according to claim 14, wherein the demodulator is a quadrature amplitude modulation (QAM) demodulator configured to calculate distances between (i) each transmit symbol in the received signal and (ii) a plurality of constellation points, where each constellation point corresponds to user data for the multiple users including the first user and the second user.

16. An apparatus according to claim 14, wherein the decoder is a Viterbi decoder.

17. A method for processing a received signal that includes a plurality of user signals, the plurality of user signals including at least a first user signal and a second user signal, wherein the first user signal corresponds to first user data that has been encoded independently of second user data corresponding to the second user signal, the method comprising:
- determining an expected symbol value based on modulation information corresponding to multiple user signals including the first user signal and the second user signal;
- calculating distances between (i) each transmit symbol in the received signal and (ii) expected symbol values, wherein each expected symbol value corresponds to user data for multiple users including the first user and the second user;
- calculating a plurality of branch metrics corresponding to the first user data, each branch metric calculated based on a respective minimum distance in a respective plurality of distances for all possible values corresponding to the second user signal; and
- decoding the first user data in the received signal based on the calculated branch metrics.

18. A method for processing a received signal that includes a plurality of user signals, the plurality of user signals including at least a first user signal and a second user signal, wherein the first user signal corresponds to first user data that has been encoded independently of second user data corresponding to the second user signal, the method comprising:
- determining an expected symbol value based on modulation information corresponding to multiple user signals including the first user signal and the second user signal;
- calculating distances between (i) each transmit symbol in the received signal and (ii) expected symbol values, wherein each expected symbol value corresponds to user data for multiple users including the first user and the second user;
- calculating a plurality of branch metrics corresponding to the first user data, each branch metric calculated based on a respective sum of exponentials of a respective plurality of distances for all possible values corresponding to the second user signal; and
- decoding the first user data in the received signal based on the calculated branch metrics.

19. An apparatus for demodulating and decoding a received signal that includes a plurality of user signals, the plurality of user signals including at least a first user signal and a second user signal, wherein first user data in the first user signal is encoded with a finite state machine encoder independently of second user data in the second user signal, the apparatus comprising:
- a demodulator to demodulate the received signal based on calculating distances between (i) transmit symbols in the received signal and (ii) expected symbol values, wherein each expected symbol value corresponds to user data for multiple users including the first user data and the second user data; and
- a decoder having a branch metric calculator to calculate a plurality of branch metrics corresponding to the first user data, each branch metric calculated based on a respective minimum distance in a respective plurality of distances for all possible values corresponding to the second user data,
- wherein the decoder is configured to decode the first user data in the received signal based on the calculated branch metrics.

20. An apparatus for demodulating and decoding a received signal that includes a plurality of user signals, the plurality of user signals including at least a first user signal and a second user signal, wherein first user data in the first user signal is encoded with a finite state machine encoder independently of second user data in the second user signal, the apparatus comprising:
- a demodulator to demodulate the received signal based on calculating distances between (i) transmit symbols in the received signal and (ii) expected symbol values, wherein each expected symbol value corresponds to user data for multiple users including the first user data and the second user data; and
- a decoder having a branch metric calculator to calculate a plurality of branch metrics corresponding to the first user data, each branch metric calculated based on a respective sum of exponentials of a respective plurality of distances for all possible value corresponding to the second user data, and
- wherein the decoder is configured to decode the first user data in the received signal based on the calculated branch metrics.

* * * * *